(12) United States Patent
Scheer et al.

(10) Patent No.: US 8,003,305 B2
(45) Date of Patent: Aug. 23, 2011

(54) METHOD FOR PATTERNING A SEMICONDUCTOR WAFER

(75) Inventors: Steven Scheer, Austin, TX (US); Uwe Paul Schroeder, Lake Carmel, NY (US)

(73) Assignees: International Business Machines Corporation, Armonk, NY (US); Infineon Technologies AG, Neubiberg (DE)

(*) Notice: Subject to any disclaimer, the term of this patent is extended or adjusted under 35 U.S.C. 154(b) by 762 days.

(21) Appl. No.: 12/041,500

(22) Filed: Mar. 3, 2008

(65) Prior Publication Data
US 2009/0220893 A1    Sep. 3, 2009

(51) Int. Cl.
*G03F 7/26* (2006.01)
(52) U.S. Cl. .................................. 430/314; 430/316
(58) Field of Classification Search .................. 430/316, 430/314, 313
See application file for complete search history.

(56) References Cited

U.S. PATENT DOCUMENTS

| | | | | |
|---|---|---|---|---|
| 6,159,661 A | * | 12/2000 | Huang et al. | 430/313 |
| 6,355,503 B2 | * | 3/2002 | Schroeder | 438/116 |
| 2005/0255633 A1 | * | 11/2005 | Hacke | 438/106 |
| 2006/0103694 A1 | * | 5/2006 | Nguyen | 347/47 |

* cited by examiner

*Primary Examiner* — Kathleen Duda
*Assistant Examiner* — Caleen O Sullivan
(74) *Attorney, Agent, or Firm* — Slater & Matsil, L.L.P.

(57) ABSTRACT

A method for etching a pattern on a surface is disclosed. A mask layer is disposed over a surface and a resist is disposed over the mask layer. The resist is exposed to light through the mask exposing primary pattern and sidelobe regions. The resist is developed and the mask layer is etched according to the resist pattern. A first material is deposited over the mask layer, wherein a gap is formed beneath the material and over the primary pattern region. The material is etched back so that the gap is exposed, and the primary pattern region is etched using the first material as a mask.

25 Claims, 7 Drawing Sheets

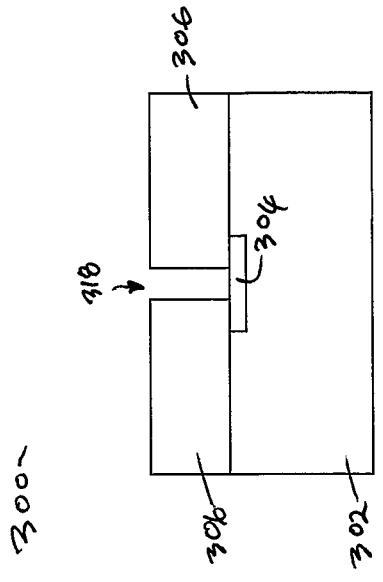
Figure 3k
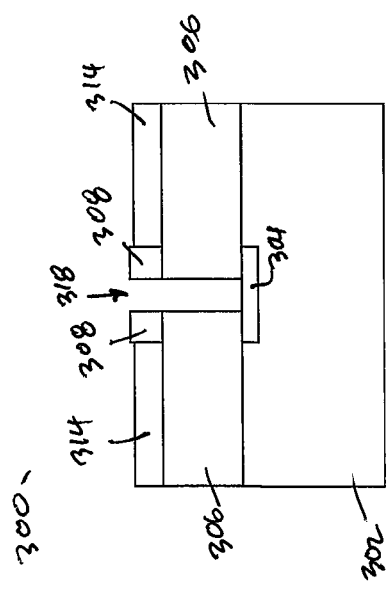
Figure 3l
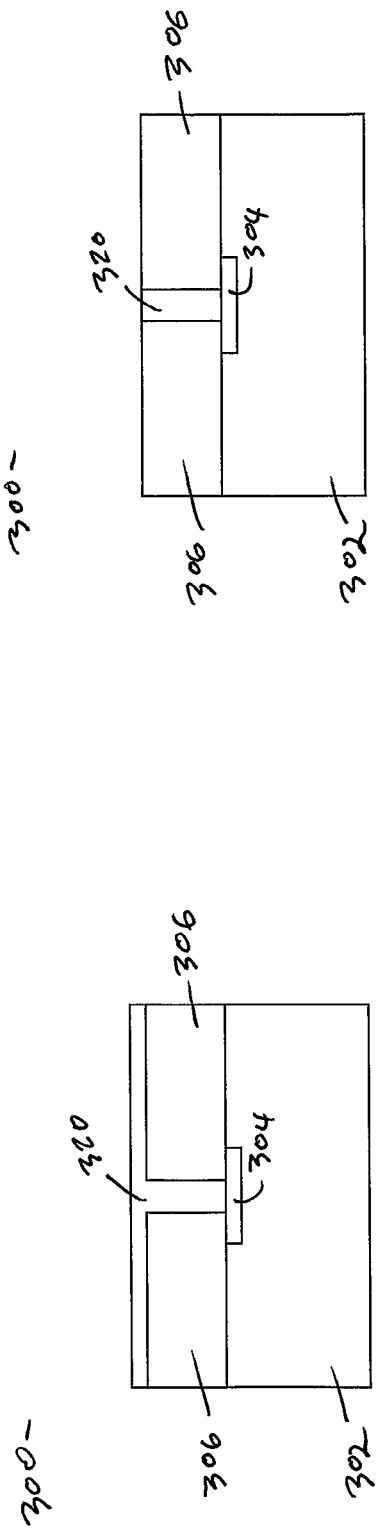
Figure 3m
Figure 3n

METHOD FOR PATTERNING A SEMICONDUCTOR WAFER

TECHNICAL FIELD

This invention relates generally to the fabrication of semiconductor devices and particularly to a patterning method.

BACKGROUND

The accurate reproduction of patterns on the surface of a semiconductor substrate is critical to the proper fabrication of semiconductor devices. The semiconductor substrate may have undergone previous fabrication processes and may already feature layers and structures created by those fabrication processes. Improperly reproduced patterns can result in semiconductor devices that do not operate to design specifications or that do not operate at all. For example, transistors can be created with improperly sized gates; conductors can be created that are short circuited or open circuited with other conductors or devices; structures can be created with wrong geometries, and so forth. Improperly reproduced patterns can reduce the yield of the fabrication process, thereby increasing the overall cost of the product. The reproduction process typically involves the use of optical lithography to reproduce the patterns onto the surface of the semiconductor substrate followed by a variety of processes either to subtract (for example, etch) or to add (for example, deposit) materials from and to the semiconductor substrate.

However, as the dimensions of the structures making up the patterns continue to become smaller, their sizes approach the wavelengths of the light used in optical lithography. Interference and processing effects can cause distortion and deviation in the mask's patterns as they are reproduced onto the semiconductor substrate.

Shrinking device geometries also have a particularly acute affect on patterning small contact holes. As contact holes become smaller, masks used to pattern contact holes require smaller apertures. The smaller the aperture, the more difficult it is to get enough light through the aperture to adequately expose the resist disposed on the semiconductor wafer below. If not enough light is used to expose the mask, a pattern will not print on the resist below. If, on the other hand, the mask and semiconductor wafer is exposed with a high intensity of light, the exposed pattern below becomes washed out and sidelobes are exposed beyond the desired perimeter of the exposed area. Consequently, the generation and exposure of small contact whole regions require a very narrow lithographic process window, thereby limiting the range of exposure settings that will produce an adequate exposure. These exposure settings can include illumination or dose, focus, numerical aperture, and light coherence factor, sigma.

In the field of small, densely packed application is using small lithographic geometries, what is needed is a method that can optimally expose a small geometric feature, such as a contact hole.

SUMMARY OF THE INVENTION

In one embodiment, a method for etching a pattern on a surface is disclosed. A mask layer is disposed over a surface and a resist is disposed over the mask layer. The resist is exposed to light, and a primary pattern and sidelobe regions are exposed. The resist is developed and the mask layer is etched according to the resist pattern. A first material is deposited over the mask layer, wherein a gap is formed beneath the first material and over the primary pattern region. The first material is etched back so that the gap is exposed, and the primary pattern region is etched using the first material as a mask.

The foregoing has outlined rather broadly features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to preferred embodiments in a specific context, namely an optical lithography method for the reproduction of patterns of very small dimensions. This invention may also be applied to semiconductor fabrication processes where other forms of lithography are used, for example, where the wavelength of the electromagnetic waves used to transfer the patterns is on the same order as the pattern dimensions. The present invention can also be used in lithographic processes outside the semiconductor field, for example, in processes where the interaction between wavelength, numerical aperture of the imaging system, and minimum pitch between structures distort the reproduction of mask patterns, or where small features require masks with very small apertures.

Figure 1:
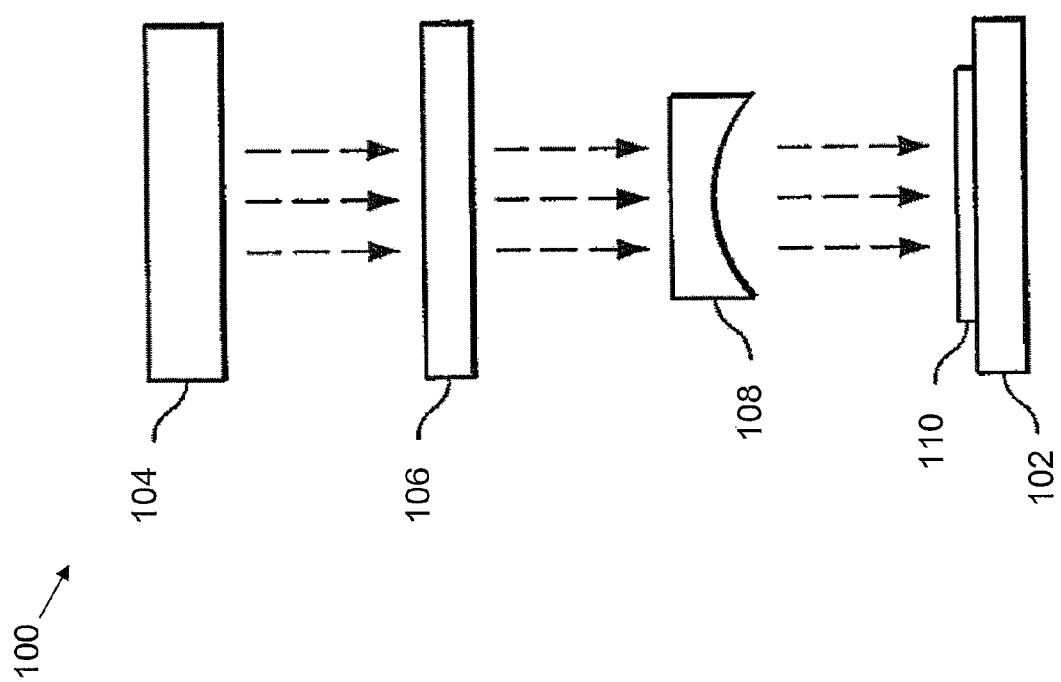
FIG. 1 is a diagram of an embodiment photolithography system.

In various embodiments of the invention, methods can be devised to improve the patterns and structures created on the surface of the silicon wafer. An apparatus 100 for patterning the surface of a semiconductor wafer 110 is shown in FIG. 1. Stage 102 is adapted to support a semiconductor wafer 110.

Stage 102 may be adapted to move the entire wafer 110 from position to position in order to expose portions of a resist over the surface of wafer 110 during the patterning process, and is adapted to securely hold the wafer 110 in place. Lens 108, which is disposed above wafer 110, typically comprises a demagnification lens that reduces the image transferred to wafer 110 by about 4-5×, for example. While lens 108 is depicted in the figure as a single lens, lens 108 will, in most cases, include a system of lenses. Alternatively, no lens 108 may be required if a 1:1 ratio magnification scheme is used for transferring the pattern from mask 106 to the wafer 110. A mask 106 having the desired pattern to be transferred to the wafer 110 is disposed above lens 108. A light or energy source 104 is disposed above mask 106, as shown.

To pattern the wafer 110, light source 104, which may comprise a laser or ultraviolet light, for example, is illuminated. In preferred embodiments of the present invention, light source 104 can be an ArFl laser which typically produces a wavelength of about 192 nm, or an XMR laser which typically produces a wavelength of about 228 nm. Other light sources, however, may be used in other embodiments. Light passes through mask 106, and demagnification lens 108, and exposes portions of the photoresist on the top surface of semiconductor wafer 110.

Various types of exposure systems function similarly to apparatus 100 illustrated in FIG. 1. In a step and repeat system, the pattern of mask 106 is transferred onto one section of wafer 110 at a time. Stage 102 moves wafer 110 from place to place, exposing wafer 110 surface in a plurality of steps. Alternatively, other systems can be used to pattern and expose wafer 110 such as a step and scan apparatus.

In a preferred embodiment of the present invention, illumination, process and enhancement techniques are used to modify patterns on mask 106 and thereby improve the integrity of exposed images on wafer 110.

In a conventional integrated circuit lithography system, an ideal mask pattern using a given mask technique is designed for a given integrated circuit layout. FIG. 2a illustrates an exemplary mask pattern 200 for a contact hole. It can be seen, however, that mask pattern 200 can also be illustrative of any small geometry feature. In conventional embodiments, mask pattern 200 may reside on a 6% attenuated phase shift mask (attPSM) which includes transparent region 204, and semi-opaque region 202. Using 6% attPSM, Semi-opaque region 202 passes about 6% illumination presented to the mask with a 180° phase shift compared to transparent region 204. Mask pattern 200 is illuminated in the context of the lithography system shown in FIG. 1, where the shape of transparent region 204 is ideally transferred to a wafer using a layer of photosensitive resist layer disposed across the surface of the wafer. Providing enough light to adequately illuminate the semiconductor wafer can pose a challenge in conventional lithography systems.

Using an attenuated phase shift mask increases the contrast of the transferred image with respect to masks that contain only opaque and transparent regions. Because of the 180° phase shift of the semi-opaque region, destructive interference at the boundary of the opaque and semi-opaque regions increases the contrast on the exposed target, yielding a more prominent non-exposed region adjacent to the exposed region.

One drawback of using an attenuated phase shift mask is its propensity to print sidelobes, which are exposed regions outside of the desired exposure region. In order to compensate for these undesired effects, the use of forbidden zones or complicated mask technology, for example, tritone masks involving chrome shields must be implemented.

Embodiments of the present invention circumvent the problem of printing sidelobes by implementing a gap process. Small geometric regions, such as contacts, are printed using a high transmission (HT) darkfield attenuated mask using partially coherent light under what would be normally be considered overexposed illumination conditions. Consequently, massive sidelobe printing occurs leaving only "silo shaped" structures in the resist enclosing contacts hole areas. In preferred embodiments of the present invention, these silo shaped structures are transferred into a hard mask layer using an etching process, resulting in very small holes that define the contact areas. After a transfer etch, a highly viscous material is spun over the silo shaped structures. Because of its viscosity, the highly viscous material does not fill the interior of the silo-shaped structures, but fills the slidelobe areas. After a plasma recess, the contact areas are once again exposed, but the sidelobe areas still contain the highly viscous material. The pattern, can then be transferred to the semiconductor wafer.

Figure 3B:
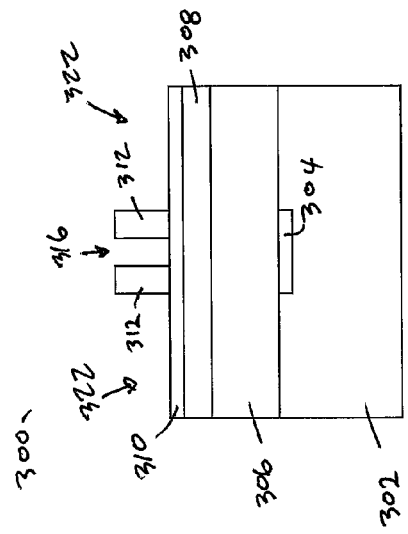
FIGS. 3a-3n illustrate an embodiment process for forming a pattern on a semiconductor wafer.
Figure 3D:
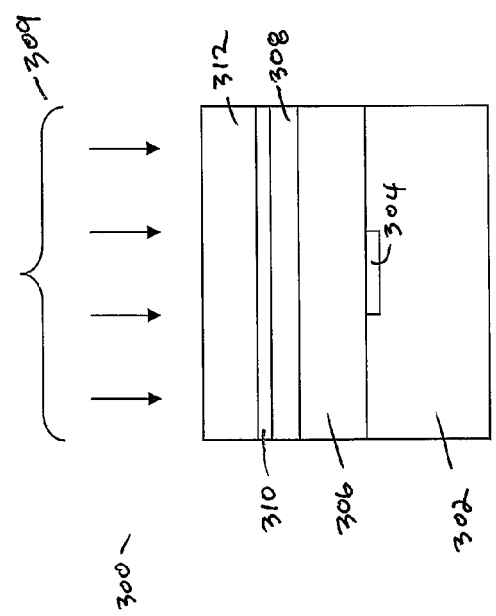
Figure 3A:
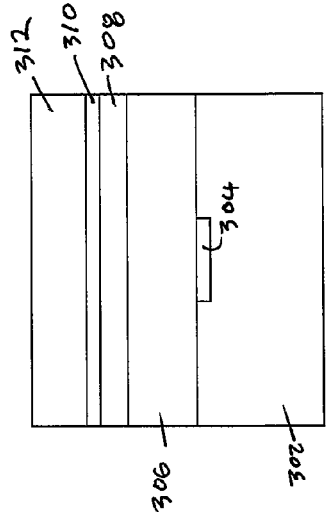

FIGS. 3a-3n illustrate a method for the formation of a contact hole according to a preferred embodiment of the present invention.

Referring first to FIG. 3a, a cross-section of a semiconductor wafer is shown. Substrate 302 represents a semiconductor wafer. Substrate 302 can include bulk silicon, doped and implanted regions, metallization layers, and circuit devices, such as transistors, resistors and capacitors, for example. Conductive region 304 represents a variety of conductive regions in a semiconductor circuit process. Conductive region 304 can represent aluminum metallization, copper metallization, or a polysilicon region that is used as an interconnect or contact region, or other conductive regions. In preferred embodiments of the present invention, conductive region 304 is typically coupled to integrated circuit devices or other conductive regions such as metallization layers.

During processing of the semiconductor wafer, after the formation of circuit devices (not shown), an interlevel dielectric (ILD) layer 306, is deposited over substrate 302. ILD layer 306 may include materials such as doped glass (BPSG, PSG, BSG), organo silicate glass (OSG), fluorinated silicate glass (FSG), spun-on-glass (SOG), silicon nitride, and PE plasma enhanced tetraethyloxysilane (TEOS), as examples. ILD layer 306 is formed using conventional techniques. In alternative embodiments of the present invention, however, holes may be etched directly into the surface of substrate 302 without intervening ILD layer 306.

Turning to FIG. 3b, a hard mask layer 308 is applied over ILD layer 306 according to preferred embodiments of the present invention. Hard mask layer 308 may comprise a nitride material such as silicon nitride, an oxide material such as silicon dioxide, a nitridized oxide, or multiple layers and combinations thereof, for example, although alternatively, hard mask 308 may comprise other materials. In some embodiments, hard mask 308 may comprise a trilayer including two nitride layers with an oxide layer disposed between the nitride layers. A plurality of alternating silicon dioxide layers and silicon nitride layers may be used for hard mask 308, to provide etch selectivity and etch stop layers for subsequent etch processes, for example. Hard mask 308 preferably comprises a thickness of between about 20 nm and about 200 nm, preferably about 100 nm, of silicon nitride and/or silicon dioxide. Alternatively, the hard mask 308 may comprise other dimensions and materials.

In preferred embodiments of the present invention, an anti-reflective coating (ARC) layer 310 is deposited over hard mask layer 308, as shown, using conventional techniques known in the art. An ARC is a thin layer adapted to absorb light that prevents or reduces light from reflecting back towards the light source. ARC 310 is typically used in lithography processes because thin films used in semiconductor manufacturing may be quite reflective. ARC 310 may consist of an organic material such as a novolac resin, or a photoresist that includes a dye, or other ARC materials, such as Clariant ARC EB18B manufactured by Clariant, or ARC AR40 manufactured by Brewer Science, for example. In preferred embodiments of the present invention, ARC 310 has a thickness of between about 40 nm and about 120 nm, preferably about 100 nm. In alternative embodiments, ARC 310 may thinner or thicker than the preferred embodiment thicknesses. In other embodiments, ARC 310 may not be deposited.

After ARC 310 is deposited, a layer of resist 312 is deposited as shown in FIG. 3b. Resist layer 312 is deposited over the ARC layer 310. Resist layer 312 may be organic. The resist layer 312 may optionally be baked to form a hard baked, thermally or chemically cross-linked resist. Although only a single layer of resist 312 is shown, resist layer 312 may comprise multiple layers. For example, in some embodiments, the resist layer 312 may be a bilayer or trilayer film comprising different materials. In preferred embodiments of the present invention, resist layer 312 is preferably made of a photosensitive, aqueous soluble polymer, and comprises a thickness of between about 100 nm and about 200 nm, preferably about 150 nm. Alternatively, other thicknesses and materials may be used.

Figure 2B:
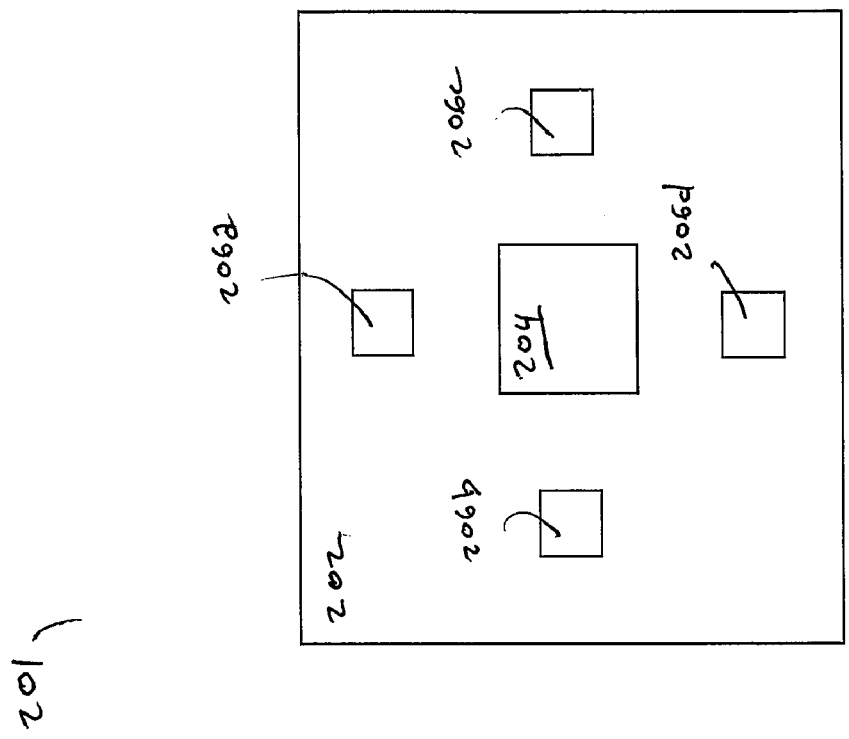
FIGS. 2a-2b illustrate embodiment mask patterns for a contact hole.
Figure 2A:
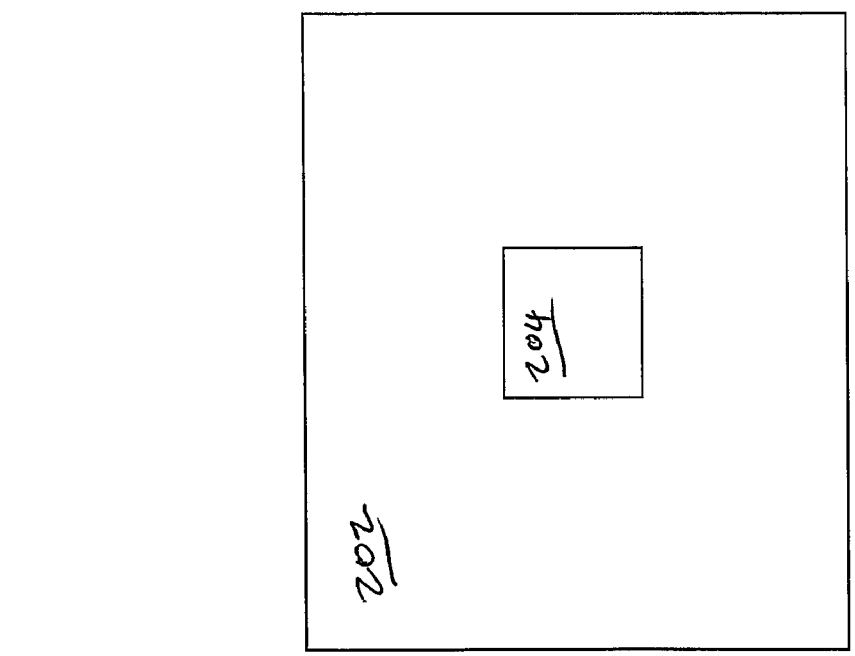
Figure 3C:
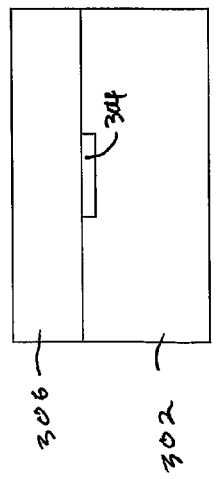

Turning to FIG. 3c, resist layer 312 is exposed using high transmission photomask 200 shown in FIG. 2a. In preferred embodiments of the present invention, photomask 200 is preferably a 20% high transmission attenuated phase shift mask (20% attPSM), although other transmission values between 6% and 60% may be used. Alternatively, high transmission attenuated phase shift masks of other transmission values outside this range may also be used. As discussed hereinabove, photomask 200 consists of a transparent region 204 and semi-opaque region 202. In preferred embodiments of the present invention where small contact holes are to be etched, transparent region 204 is between about 200 nm and about 480 nm wide, preferably about 300 nm wide, assuming a 4:1 ratio magnification scheme of the mask. A 300 nm wide transparent region 204 on the mask will result in a printed circular region on the resist with a diameter of about 75 nm. In alternative embodiments of the present invention, other magnification schemes and other mask dimensions may be used.

Turning to FIG. 2b, alternative embodiment photo mask 201 is shown. In addition to transparent region 204 representing the main feature, transparent regions 206a-d representing assist features are disposed around transparent region 204. These assist features 206a-d are a form of optical proximity correction (OPC) that corrects imaging distortions that occur when the light wavelength is on the same order as the mask and target image dimensions. OPC is normally performed using computer-aided design (CAD) tools and involves partitioning of edges of pattern structures into multiple fragments, the locations of which can be optimized to yield the desired reproduced pattern. In alternative embodiments, OPC assist features 206a-d can be placed using dataprep at predefined or modeled distances away from main feature 204, for example at 0.25× to 1× the wavelength of the light source that will illuminate mask 201. These assist features 206a-d can be used to increase the resolution of the printed image, as well as increase the lithographic process window of main feature 204. Assist features 206a-d may range in size from 20 nm to 50 nm for a main feature 204 size of between 50 nm to 120 nm, and may be square, rectangular, or of other varying shapes. It should be noted that assist features described herein are provided as examples. In other alternative embodiments, any suitable OPC technique can be used to improve the resolution and process window of main feature 204. Photmask 201 may be a high transmission attenuated phase shift mask, or an other type of mask, such as a binary mask.

Turning back to FIG. 3c, resist layer 312 is exposed to illumination 309 through photo mask 200 (FIG. 2a) or 201 (FIG. 2b). In preferred embodiments of the present invention, illumination 309 is provided by a semicoherent monochromatic light source such as an ArFl or XMR laser with a wavelength of 192 nm or 248 nm respectively. A partial coherence factor, sigma between about 0.1 and about 0.5, preferably about 0.3 is used with a numerical aperture of between about 0.75 and about 1.5, preferably about 1.2. The exposure time and illumination intensity should be large enough to overexpose resist layer 312 so that sidelobe regions are exposed. In alternative embodiments, other light sources, coherence factors, numerical apertures, and exposure times may be used.

FIG. 3d shows a cross-section of the semiconductor wafer 300 after the resist layer 312 is developed. Developing the resist is performed using standard techniques, preferably using an aqueous based developer such as TMAH, for example, although other forms of developing resist such as solvent developing can be used. After resist 312 is exposed and developed, only a small section of resist 312 remains encircling primary exposed area 316 which defines a contact hole geometry. Resist 312 that was present over sidelobe regions 322 is also eliminated, leaving these regions of the semiconductor wafer exposed. Remaining resist 312 forms a "silo shaped" structure as shown in FIG. 3d.

Figure 3G:
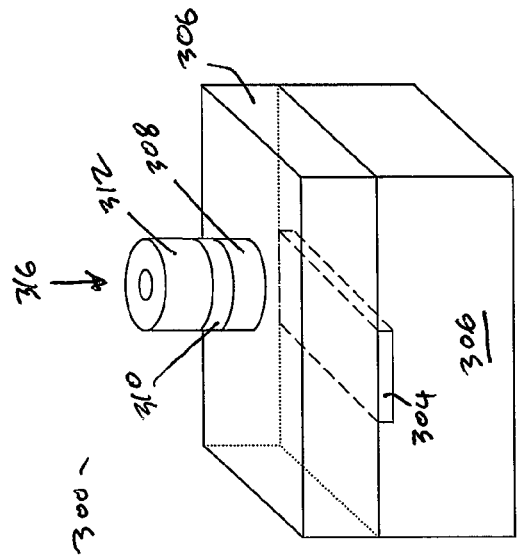
Figure 3E:
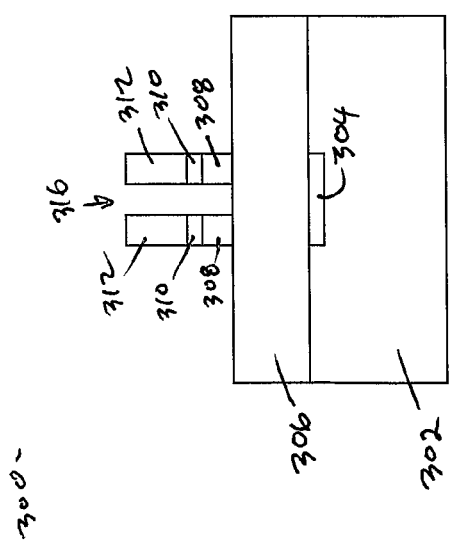
Figure 3F:
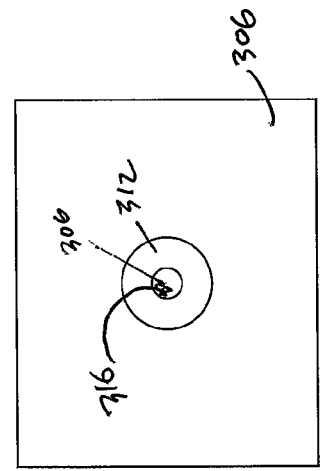

After resist 312 is developed, ARC layer 310 and hard mask layer 308 are etched using resist layer 312 as a transfer mask, as shown in FIG. 3e. In preferred embodiments of the present invention, etching is performed using a reactive ion plasma etcher. In alternative embodiments of the present invention, however, other etching techniques, such as wet etching can be used. The etching process transfers the silo-shaped section of resist 312 to the ARC layer 310 and the hard mask layer 308. FIG. 3f shows a top view of the etched resist 312, and FIG. 3g shows a three-dimensional view. It can be seen that the resist 312, ARC 310, and hard mask 308 surrounds a small gap 316. After the transfer etch, resist 312 and ARC layer 310 are stripped using standard techniques, leaving the cross-section as shown in FIG. 3h.

Figure 3I:
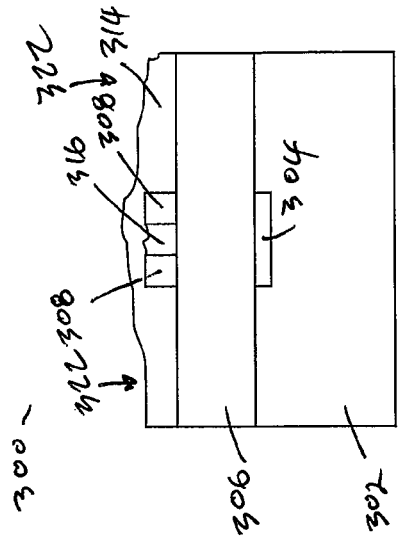
Figure 3H:
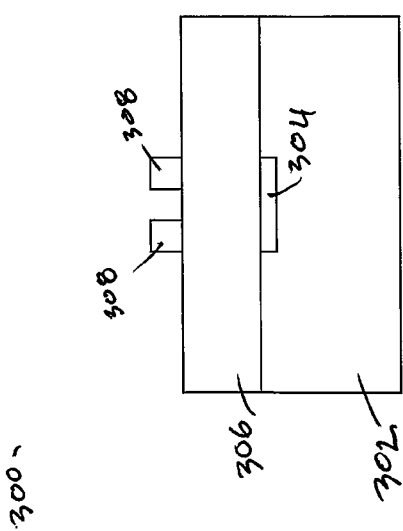

Turning to FIG. 3i, a highly viscous material 314 is spun onto the wafer. In preferred embodiments of the present invention, viscous material 314 is an i-line resist and comprises a viscosity sufficient to leave a small gap over primary exposure area 316, yet still be able to cover sidelobe exposure areas 322. Highly viscous material 314 preferably comprises a high molecular weight organic polymer spun out of solvent, such as DNQ-Novolac resin manufactured by AZ Electronics, although other viscous materials may be used. The viscosity of highly viscous material 314 is preferably about 20 cP, and can range from between about 5 cP to about 50 cP in preferred embodiments of the present invention. The thickness of highly viscous material 314 is preferably about 1500 nm and can range from about 500 nm to about 3000 nm. It should be noted that in alternative embodiments of the present invention, other materials besides the highly viscous material described hereinabove may be used. For example, a CVD oxide fill can be used after hard mask structuring, where the process is adjusted to enclose small gaps by larger growth at corners, so that a gap forms above primary exposure area 316.

Other materials of varying properties viscosities can also be used as long as a gap is formed over primary exposure area 316.

Figure 3J:
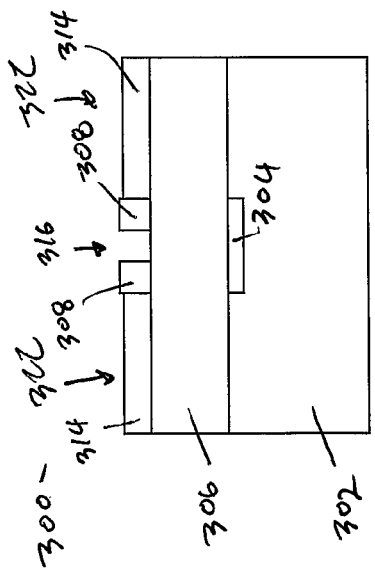

After viscous material 314 is applied, viscous material 314 is etched back, exposing the gap over primary exposure area 316, while sidelobe exposure areas 322 remain covered as shown in FIG. 3j. In preferred embodiments of the present invention, a recess etch is used, preferably an oxygen containing plasma etch according to standard techniques. In alternative embodiments of the present invention, other etch back techniques can be used, for example, chemical-mechanical polishing (CMP).

Turning to FIG. 3k, contact hole 318 is etched through ILD 306 using hard mask layer 308 and viscous material 314 as a mask. In preferred embodiments of the present invention, contact hole 318 is etched using a reactive ion etch, although other etch techniques can be used in alternative embodiments. Hard mask 308 and viscous material 314 is then stripped, preferably using a standard technique such as a wet etch as shown in FIG. 3l. Alternative stripping techniques such as reactive ion plasma etching can also be used.

Conductive material 320 is deposited contact hole 318 and over the surface of ILD 306 using conventional techniques, as shown in FIG. 3m. In preferred embodiments of the present invention, conductive material 320 may have a plurality of conductive layers. For example, a barrier layer (not shown) may deposited first, followed by conductive fill materials such as copper, aluminum, tungsten, or combinations or alloys thereof. Alternatively, conductive material 320 may comprise other materials. Conductive material 320 may include a seed layer (not shown) that is deposited or formed over a barrier layer (not shown) before depositing the conductive fill material 320. For example, if the conductive material 320 comprises copper, a copper seed layer comprising about 500 Angstroms of less of pure copper may be formed over the barrier layer (not shown), and copper conductive material 320 may then be electroplated. Alternatively, other materials may be deposited using conventional processes to facilitate the deposition of the conductive material 320, such as a HfN/Hf or AlN/Hf material stack, for direct plating of the conductive material 320, for example.

As shown in FIG. 3n, excess conductive material 320 and any barrier layers (not shown) disposed over the surface of ILD layer 306 may then be removed using a CMP process, thereby leaving conductive contact 320.

Once contact or via 320 is formed, processing of the semiconductor wafer may continue with the fabrication of further metallization and dielectric layers until the semiconductor wafer is completely fabricated. It should be noted that embodiments of this invention do not necessarily have to be used to form contacts in ILD layers. Embodiments of the present invention may also be directed to the formation of vias in ILD layers, or conductive interconnects within the silicon wafer itself.

Figure 4:
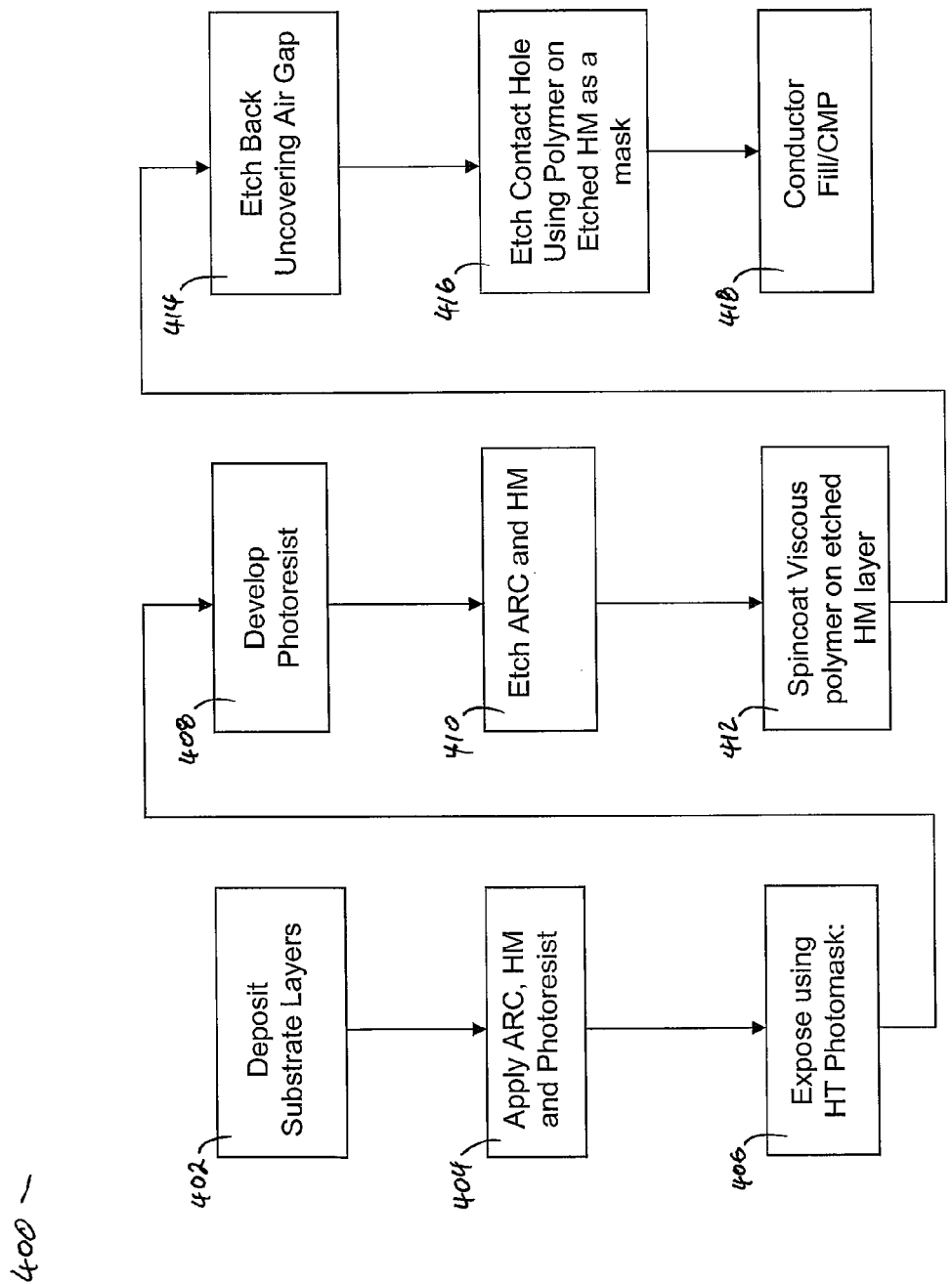
FIG. 4 contains a flowchart describing an embodiment fabrication process according to a preferred embodiment of the present invention.

Turning to FIG. 4, process flowchart 400 in accordance with a preferred embodiment of the present convention as shown. In step 402 processing of the substrate layers as well as the front end of line (FEOL) processing is performed. Step 402 may consist of the formation of wells, doped regions, the formation of devices such as resistors capacitors and transistors, as well as the formation of lower-level interconnect such as metallization layers or polysilicon layers. Step 402 may also consist of the deposition of the first ILD layer, however, the ILD layer may not be formed the prior to the implementation of embodiments of the present invention.

In step 404, an antireflective coating ARC is formed followed by the formation of a hard mask layer. In some embodiments of the present invention, the ARC layer may be omitted. Following the deposition of the ARC layer and the hard mask layer, photoresist is deposited on top of the hard mask layer in accordance with techniques described hereinabove.

In step 406, the photoresist is exposed using a high transmission attenuated phase shift mask, as described hereinabove. This exposure is preferably performed using a partially coherent light with a sigma of between about 0.1 and about 0.5, preferably about 0.3, where a sigma of zero represents coherent light and a sigma of one represents totally incoherent light. For the present invention a 20% high transmission attenuated phase shift mask is used, and the thickness of the mask layer is preferably one half of the wavelength of the light used for exposure. Other parameters for the exposure of the photoresist are described hereinabove.

In step 408 the photoresist is developed the preferably using an aqueous-based developer, and in step 410, the ARC and hard masks are etched using the developed photoresist as a transfer pattern. The ARC and mask layer form a silo shaped structure surrounding a primary exposure area as described hereinabove.

In step 412 a highly viscous material, preferably a viscous polymer, is spin-coated on the hard mask layer leaving a gap above the primary exposure area. After the highly viscous material is spin coated on the hard mask layer, the viscous is etched back exposing the hard mask and, uncovering the gap over the primary exposure area, while leaving viscous material covering a sidelobe exposure area outside of the silo shaped hard mask structure in step 414.

In step 416, a contact hole is etched using the hard mask and the highly viscous material as mask. In step 418, the contact hole is filled with a conductive material, and CMP is performed to remove excess conductive material from the surface of the semiconductor wafer. Processing then continues until the fabrication of the wafer is completed. It should be noted that in alternative embodiments of the present invention, other process flows may be used, for example dual damascene flows.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method for etching a pattern on a surface, the method comprising:
   disposing a mask layer over the surface;
   disposing a resist over the mask layer;
   exposing the resist to light, wherein the light exposes a primary pattern region and sidelobe regions disposed outside the primary pattern region;
   developing the resist;
   etching the mask layer after developing the resist;
   depositing a first material over the surface after etching the mask layer, wherein an unfilled gap is formed beneath the first material and above a portion of the surface corresponding to the primary pattern region;
   etching back the first material, wherein the unfilled gap is exposed and portions of the surface corresponding to the sidelobe regions remain covered with the first material; and
   etching the portion of the surface corresponding to the primary pattern region using the first material as a mask.

2. The method of claim 1, wherein etching the primary pattern region comprises forming a void.

3. The method of claim 2, wherein the void comprises a contact hole.

4. The method of claim 3, further comprising filling the contact hole with a conductive material.

5. The method of claim 1, wherein the mask layer comprises a hard mask.

6. The method of claim 1, wherein the first material comprises a viscous material.

7. The method of claim 6, wherein the viscous material comprises a viscous polymer.

8. The method of claim 1, wherein the first material comprises a CVD oxide.

9. The method of claim 1, wherein exposing the resist to the light comprises shining a light source through a high transmission phase shift mask.

10. The method of claim 9, wherein the light source comprises:
    a partial coherence factor of between about 0.1 and about 0.5; and
    a numerical aperture of between about 0.75 and about 1.35.

11. A method of patterning a semiconductor wafer, the method comprising:
    depositing a hard mask over a surface of the semiconductor wafer;
    depositing a resist over the hard mask;
    illuminating the resist, the illuminating comprising exposing a primary pattern region and a sidelobe region disposed outside of the primary pattern region;
    developing the resist after illuminating the resist;
    etching the hard mask after developing the resist;
    depositing a masking material over the hard mask and the semiconductor wafer after etching the hard mask, wherein an unfilled gap is formed between the masking material and a portion of the surface of the semiconductor wafer corresponding to the primary pattern region;
    etching the masking material, wherein the unfilled gap is exposed, but the sidelobe region remains covered with the masking material; and
    etching the portion of the surface of the semiconductor wafer corresponding to the primary pattern region.

12. The method of claim 11, wherein etching the primary pattern region comprises etching a contact hole, the method further comprising filling the contact hole with a conductive material.

13. The method of claim 11, wherein depositing the masking material comprises spincoating a viscous material.

14. The method of claim 13, wherein the viscous material comprises a viscosity of between about 4 cP and about 50 cP.

15. The method of claim 13, wherein the viscous material comprises a viscous polymer.

16. The method of claim 13, wherein illuminating the resist comprises exposing the semiconductor wafer to light using a high transmission attenuated phase shift mask.

17. The method of claim 16, wherein the high transmission attenuated phase shift mask comprises a background transmission of between about 6% and about 60%.

18. The method of claim 16, wherein illuminating the resist further comprises:
    illuminating the resist with a partially coherent light comprising a sigma of between about 0.1 and 0.5 and a numerical aperture of between about 0.75 and about 1.55.

19. The method of claim 13, further comprising forming an anti-reflective coating over the semiconductor wafer.

20. A method of forming a semiconductor device, the method comprising:
    forming a first conductive region on a surface of a semiconductor wafer;
    forming an insulating layer over the semiconductor wafer, wherein the first conductive region is covered by the insulating layer;
    forming a hard mask over the semiconductor wafer;
    forming a resist layer over the hard mask;
    exposing the resist using a high transmission phase shift mask, wherein a primary region is exposed surrounded by an exposed secondary region;
    developing the resist after exposing the resist;
    etching the hard mask, wherein a region between the primary region and the secondary region remains on the semiconductor wafer;
    depositing a viscous material on the semiconductor wafer after etching the hard mask, wherein an unfilled gap is formed between the viscous material and the semiconductor wafer in the primary region;
    etching the semiconductor wafer, wherein viscous material on the secondary region remains on the semiconductor wafer, and wherein the viscous material over the unfilled gap is etched away;
    etching a contact hole in the insulating layer at the primary region; and
    filling the contact hole with a conductive material, wherein the conductive material is electrically coupled to the first conductive region.

21. The method of claim 20, wherein the high transmission phase shift mask comprises an opening of between about 50 nm and 120 nm.

22. The method of claim 20, further comprising depositing an anti-reflective coating over the semiconductor wafer.

23. The method of claim 20, wherein depositing the viscous material comprises spincoating a viscous material on the semiconductor wafer, and wherein the viscous material comprises a viscosity of between about 5 cP and 50 cP.

24. The method of claim 20, wherein the viscous material comprises a high molecular weight organic polymer spun out of solvent.

25. The method of claim 24, wherein the viscous material comprises DNQ-Novolac resin spun out of organic solvent.

* * * * *